United States Patent [19]

Gurke et al.

[11] Patent Number: 4,594,562
[45] Date of Patent: Jun. 10, 1986

[54] AMPLIFIER WITH CURRENT-VOLTAGE CONVERSION, PARTICULARLY PREAMPLIFIER OF AN OPTICAL RECEIVER

[75] Inventors: Reinhard Gurke, Windeck-Schladern; Manfred Eichel, Stuttgart, both of Fed. Rep. of Germany

[73] Assignee: International Standard Electric Corporation, New York, N.Y.

[21] Appl. No.: 661,512

[22] Filed: Oct. 16, 1984

[30] Foreign Application Priority Data

Oct. 20, 1983 [DE] Fed. Rep. of Germany ....... 3338024

[51] Int. Cl.$^4$ .............................................. H03F 1/32
[52] U.S. Cl. .................................... 330/307; 330/293
[58] Field of Search ................. 330/59, 102, 260, 293, 330/300, 307

[56] References Cited

U.S. PATENT DOCUMENTS 4,464,630  8/1984  Eddins ................................. 330/307

Primary Examiner—James B. Mullins
Assistant Examiner—G. Wan
Attorney, Agent, or Firm—John T. O'Halloran

[57] ABSTRACT

A problem encountered in the design of preamplifiers of optical receivers, e.g., of so-called transimpedance amplifiers, is to achieve both a wide bandwidth and high sensitivity. The invention solves this problem primarily by a specific implementation and placement of the feedback resistor in the transimpedance amplifier type, and of the load resistor in the high-impedance amplifier type which permit a high resistance value and very low series and shunt capacitances. The resistor consists of a resistive strip (1) and conductive strips (2, 3) deposited on a substrate, the conductive strips extending parallel to the resistive strip and each having one end connected to one end of the resistive strip. To reduce shunt capacitances, the substrate is located at a distance from the metallic amplifier case and from the amplifier board.

20 Claims, 4 Drawing Figures

AMPLIFIER WITH CURRENT-VOLTAGE CONVERSION, PARTICULARLY PREAMPLIFIER OF AN OPTICAL RECEIVER

BACKGROUND OF THE INVENTION

The present invention relates to a transimpedance amplifier using current feedback through a resistor and serving to convert an input current into an output voltage.

A transimpedance amplifier of this kind is described, for example, in an article by Y. Netzer in the journal "EDN", Sept. 20, 1980, pp. 161 to 164. Transimpedance amplifiers are well suited for use as low-noise peramplifiers of optical receivers in which the light-sensitive detector is a PIN photodiode.

It is known that, for such applications, the value of the feedback resistor of the transimpedance amplifier should be as large as possible to minimize the amplifier's input noise, which is determined essentially by the noise current of the resistor, and that the product of the feedback resistance and the amplifier's input capacitance should be as small as possible to obtain maximum bandwidth. (The bandwidth is approximately proportional to $A/(R \cdot C)$, where A is the open-loop gain, R is the value of the feedback resistor and C is the amplifier's input capacitance).

Thus, a large feedback resistance improves the noise characteristics but reduces the bandwidth, so that it is considered difficult to develop amplifiers which have both a wide bandwidth and low input noise.

From "Electronics Letters", Vol. 15, No. 20, pp. 650 to 652, a transimpedance amplifier is known which has a considerable bandwidth, namely 112 MHz, but, because of the small feedback-resistor value of 5.1 k$\Omega$, exhibits too high input noise and, thus, too low sensitivity to meet the requirements placed on optical receivers.

SUMMARY OF THE INVENTION

It is, therefore, the object of the invention, to provide a transimpedance amplifier which has both a wide bandwidth and low input noise and, thus, a high sensitivity.

This object is attained in that the feedback resistor is constituted by a resistive strip provided on a substrate and having two spaced ends, that at least one pair of separate conductive strips lying on a straight line extend parallel to the resistive strip on the substrate and each has one end close to and another end remote from the respective other conductive strip of the pair, and that each of the two other ends of the conductive strips of the pair extends, and is connected, to a different one of the two spaced ends of the resistive strip.

The solution proposed by the present invention has the following advantages.

By implementing the feedback resistor in the above-mentioned manner in conjunction with the use of the conductive strip pair the parasitic series capacitance, which contributes to the amplifier's input capacitance and, consequently, reduces the bandwidth, as is known, for example, from the first-mentioned reference, can be reduced considerably and limited to the value required to prevent the amplifier from oscillating.

Since the conductive strips are disposed beside, i.e., in the vicinity of, the resistive strip, differential shunt capacitances become effective between the conductive strips and the resistive strip, so that the feedback resistor is a complex RC network of low series capacitance which lets the current feedback be effective even at high frequencies. As a result, noise sources within the amplifier loop are reduced.

The shorter conductive strip of each pair is connected to the input, so that the shunt capacitance between the conductive strips and the opposite grounding areas which is introduced at the input is lower than that at the output.

Thus, the contribution from such shunt capacitances to the amplifier's input capacitance, which reduces the bandwidth, is kept to a minimum.

The provision of rectangularly extending extensions of the conductive strips makes it possible to adapt the series capacitance to the respective application, especially if they are located at the inner ends of the conductive strips. Such extensions also permit the introduction of low shunt capacitances to compensate for parasitic capacitances from the vicinity of the feedback resistor.

The substrate may be located at a distance from the amplifier board and the case. This ensures that shunt capacitances introduced by the resistive strip together with the conductive strips connected thereto and by the grounding areas of the amplifier board or the amplifier case are reduced to a harmless measure. An alternative step to reduce shunt capacitances between the feedback resistor and the amplifier board or the amplifier case is that the feedback resistor is located on the amplifier board, and the latter is located at a distance from the amplifier case. Then, however, it must be ensured that near the feedback resistor there are no conducting areas on the board because shunt capacitances would be introduced between those areas and the feedback. With regard to economic production, this solution to the shunt capacitance problem appears to be the more advantageous one.

While only improvements resulting exclusively from the design and location of the amplifier's feedback network, also called "$\beta$ network" have been discussed so far, the invention also provides an advantageous implementation of the forward portion V, also called "$\mu$ network", which further improves the amplifier's noise performance and bandwidth. In this implementation, the amplifier contains a cascade stage comprising a gallium arsenide field-effect transistor, which is followed by a differential amplifier whose output voltage is used as the amplifier output voltage and generates feedback current supplied to the feedback resistor. The cascade stage at the amplifier input, which is known per se, has the property that its contribution to the amplifier's input capacitance is small. The differential amplifier increases the open-loop gain and thus, according to the above relation, the bandwidth provided that the product $R \times C$ is not increased, either.

A transimpedance amplifier with a differential amplifier following the cascade stage is described in the research report BMFT-FB-T82-012, "Optisches, glasfasergebundenes Nachrichtensystem bei Wellenlängen um 200 nm", pp. 63 and 64. Nevertheless, this amplifier has a relatively small bandwidth (10 MHz), because a high valve (100 k$\Omega$) is chosen for the feedback resistor to obtain a noise improvement, and because no steps are taken to reduce the input capacitance. (For a transmission rate of 34 Mb/s, the bandwidth of this amplifier is sufficient).

Unlike this known transimpedance amplifier, which has several AC couplings (see schematic circuit diagram), the transimpedance amplifier of the present invention is directcoupled throughout. This has the advantage that DC components of the signal are not lost during processing, and that no external adjustment of the operating points of the transistors is required because the feedback compensates for component tolerances.

BRIEF DESCRIPTION OF THE DRAWING

The invention will now be explained in more detail, by way of example, with reference to the accompanying drawings, in which.

DETAILED DESCRIPTION OF THE PREFERRED EMBODIMENTS

Figure 1:
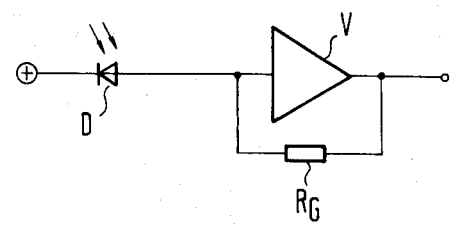
FIG. 1 is the known basic circuit diagram of a transimpedance amplifier.

A transimpedance amplifier based on the known principle shown in FIG. 1 is an amplifier with current feedback which converts an input current, e.g., the photocurrent of a photodiode D, into an output voltage, the current-to-voltage transfer ratio being equal to the value of the feedback resistor $R_G$.

Figure 2:
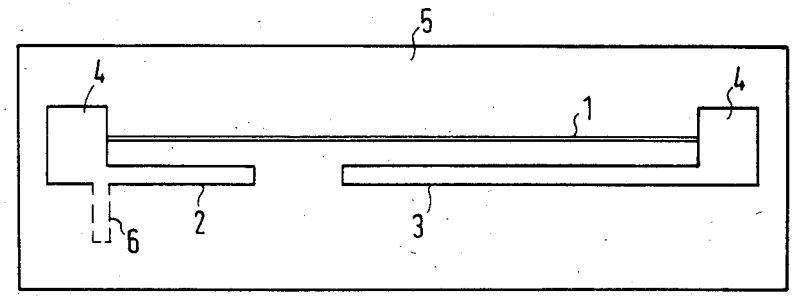
FIG. 2 is a top view of the feedback resistor of the amplifier in accordance with the invention.

According to the invention, the known problem that the parasitic series capacitance of the feedback resistor must be avoided or compensated for is solved by implementing the feedback resistor $R_G$ as shown in FIG. 2. The resistor consists essentially of a resistive strip 1, made of a material of low conductivity, and of at least one pair of conductive strips 2 and 3, made of highly conductive material, which are formed on one of the two sides of, and parallel to, the resistive strip and have their outer ends connected to the ends of the resistive strip. This connection exists because of the fact that the two outer ends of the conductive strips 2 and 3 expand into relatively large-area contact portions 4 of the same material which are connected to the two ends of the resistive strip 1. The resistive strip 1, the conductive strips 2 and 3, and the contact portions 4 are preferably deposited on a substrate 5 of insulating material using thin-film techniques. Thin-film deposition has the advantage that the resistor has a low voltage-dependent noise power. For certain applications, thick-film deposition may be appropriate.

The conductive strips 2 and 3 introduce a very low series capacitance in the range from 20 to 30 fF which can be set and easily varied by changing the distance between the two inner ends of the conductive strips as required. It should be emphasized that a slight series capacitance of the feedback resistor is necessary because a zero series capacitance would set the transimpedance amplifier oscillating at a high open-loop gain.

During operation of the resistor of FIG. 2, it turned out that the amplifier characteristics were also affected by the distance between the conductive strips 2, 3 and the resistive strip 1; this distance must not be too great. Consequently, what is also important is that differential shunt capacitances exist between the resistive strip and the conductive strips, so that this is not just a parallel combination of a capacitor and a resistor but a rather complex RC network.

Instead of one pair of conductive strips 2 and 3 as shown, two or more pairs may be provided on one or both sides of the resistive strip 1.

Since the resistor of FIG. 2 is incorporated in an amplifier with large conducting areas as grounding areas and with a preferably metallic case for hermatic sealing, shunt capacitances also exist between the feedback resistor and conducting areas of the amplifier board or amplifier case. By positioning the feedback resistor as described in the following, these capacitances can be greatly reduced, but they cannot be neutralized.

To minimize the contribution from such shunt capacitances to the amplifier's input capacitance which reduces the bandwidth as is well known, the two conductive strips 2 and 3 are of different length, and the shorter conductive strip 2 is connected to the amplifier input.

If parasitic switching capacitances have to be compensated for within the amplifier circuit, the conductive strips may have extensions 6 at suitable points, as indicated in FIG. 2 by a broken line. These extensions 6 are preferably perpendicular to the conductive strips. If such extensions are located in the regions of the inner ends of the conductive strips, the series capacitance can be additionally influenced, and by removing such extensions, it can be adjusted in a simple manner, e.g., to compensate for tolerances of the photodiode.

Figure 3:
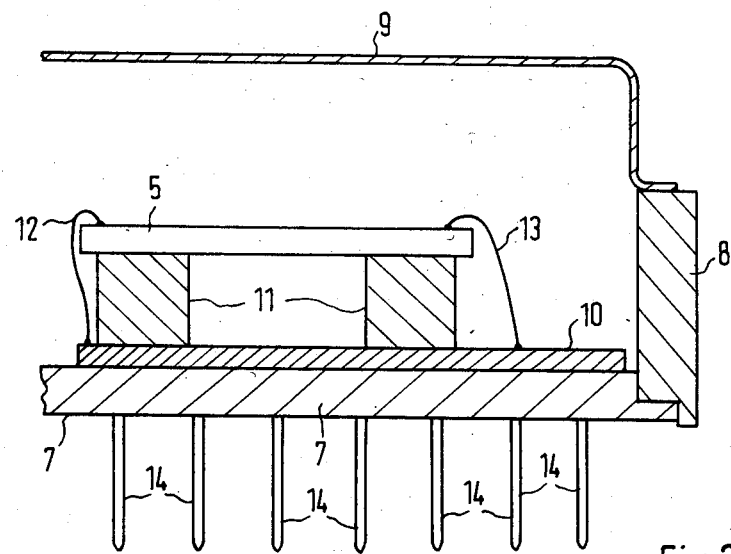
FIG. 3 is a longitudinal section through the transimpedance amplifier to illustrate the location of the feedback resistor.

The longitudinal section through part of the amplifier case shown in FIG. 3 illustrates where the substrate with the feedback resistor is located in the amplifier. This location serves to reduce shunt capacitances, as mentioned above.

Of the amplifier case, FIG. 3 shows the bottom 7, one wall 8, and the cover 9. Attached to the bottom 7 is the amplifier board 10, on which the amplifier components (not shown) are formed and mounted as a hybrid integrated circuit. Of the overall amplifier circuit, only the location of the feedback resistor is shown, which represents a preferred embodiment of the invention. The substrate 5 with a feedback resistor of the kind shown in FIG. 2 is mounted on top of two supports 11, whose undersides are mounted on the amplifier board 10. The supports 11, which are preferably of circular section and have a diameter approximately equal to the width of the substrate 5, ensure that the substrate 5 is located at a sufficient distance from the amplifier board to render shunt capacitances between the feedback resistor and the conducting areas on the amplifier board or the bottom of the case largely ineffective. For the same reasons, the height of the amplifier case is chosen so that the cover 9 and the substrate 5 are separated by a sufficient space, too.

The feedback resistor on the substrate 5 is connected into the feedback path of the circuit on the amplifier board by means of two wires 12, 13 running from its contact portions 4 (FIG. 2) to contact areas on the amplifier board. Supply and output terminals 14 protrude from the underside of the case of the transimpedance amplifier.

An alternative way of reducing such shunt capacitances which might be more advantageous from a manufacturing point of view is to make the substrate with the feedback resistor a part of the amplifier board, in which case the conducting areas must be so arranged on the amplifier board as to be sufficiently spaced from the feedback resistor, so that shunt capacitances are reduced as far as necessary. To avoid excessive shunt capacitances between the amplifier board and the case, the board is mounted within the case at a distance from the bottom and the cover of the case.

Figure 4:
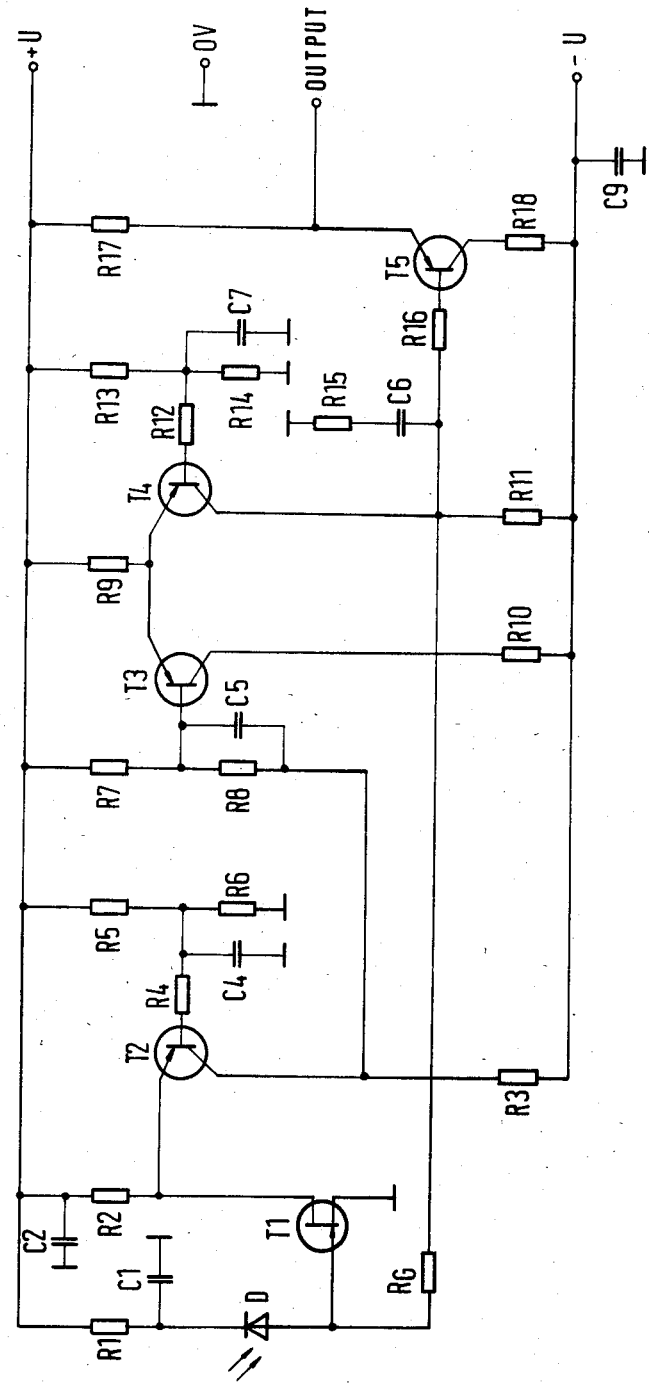
FIG. 4 is a circuit diagram of the amplifier.

The following explains with the aid of FIG. 4 what measures are taken in the circuit of the forward portion V (FIG. 1), also called "$\mu$ network", of the transimpedance amplifier to improve the amplifier characteristics.

A photodiode D, preferably a PIN photodiode, is connected in the reverse direction to the positive terminal +U of a supply-voltage source through a resistor R1. The resistor R1 and a capacitor C1, which has one terminal connected to the junction point of the resistor R1 and the diode D and the other grounded, forms a filter for suppressing radio-frequency voltages superimposed on the supply voltage. The cathode of the photodiode is grounded through the capacitor C1 to provide a path for alternating current. The photodiode controls, in a manner known per se, a cascade stage consisting of a gallium arsenide field-effect transistor T1 and a bipolar transistor T2; to this end, the anode of the photodiode is connected to the gate electrode of the field-effect transistor T1. Also connected to this gate electrode in a manner known per se is the feedback resistor $R_G$, which, however, is implemented and positioned in accordance with the invention, i.e. as described above. The source electrode of the field-effect transistor T1 is grounded, and the drain electrode is connected to the positive terminal +U of the supply-voltage source through a load resistor R2. A blocking capacitor C2 between the terminal of the load resistor R2 connected to the positive supply terminal +U and ground provides a short circuit to ground for high-frequency alternating currents. The collector of the transistor T2 is connected through a load resistor R3 to the negative supply terminal −U, which is short-circuited to ground through a blocking capacitor C9 to provide a path for alternating current. The base of the transistor T2 is connected through a low-value dropping resistor R4 to the junction of two resistors R5 and R6 inserted as a voltage divider between +U and ground. A blocking capacitor C4 is connected between the junction of the resistors R5, R6 and ground to short high-frequency alternating currents to ground, with the dropping resistor R4 preventing any high-frequency oscillation of the transistor T2.

In a preferred embodiment of the invention, the output voltage of the cascade stage is amplified in a following differential amplifier before being used to apply current feedback and to generate the amplifier output voltage (through an emitter follower). This step increases the open-loop gain A, thereby contributing, in addition to the above-described implementation of the feedback resistor in accordance with the invention, to broadening the bandwidth of the transimpedance amplifier in accordance with the relation given at the beginning.

The differential amplifier consists essentially of two bipolar transistors T3 and T4, whose emitters are connected to one terminal of the supply-voltage source through a common emitter resistor R9, and whose collectors are connected to the other terminal through collector resistors R10 and R11, respectively. The base bias for the transistor T3 is provided by a voltage divider consisting of two resistors R7 and R8 connected in series between +U and the collector of the transistor T2. The resistor R8 is bypassed by a capacitor C5 to prevent any voltage drop across the resistor R8 for the alternating-voltage signal to be coupled from the cascade stage to the input of the differential amplifier. The wiring of the base of the transistor T4 with resistors R12, R13, and R14 and a capacitor C7 is analogous to the above-described wiring of the transistor T2, so it need not be explained again. The collector of the transistor T4 is connected to the amplifier input, i.e., the gate electrode of the field-effect transistor T1, via the feedback resistor $R_G$.

The differential amplifier is followed by an emitter follower to adapt the output impedance to a low input impedance of a following main amplifier, as in the prior art amplifier. The emitter follower consists of a bipolar transistor T5, whose emitter is connected to one terminal of the supply-voltage source through an emitter resistor R17, and whose collector is connected to the other terminal through a low-value resistor R18, which prevents any high-frequency oscillation of the transistor.

The base of the transistor T5 is connected to the collector of the transistor T4 through a decoupling resistor R16. A series combination of a capacitor C6 and a resistor R15 between the terminal of the resistor R16 connected to the collector of the transistor T4 and ground serves s a stabilizing section.

The output voltage of the transimpedance amplifier is taken between the emitter of the transistor T5, which is connected as an emitter follower, and ground.

Several preamplifiers with the features of the invention illustrated in FIGS. 1 to 5 and explained in the foregoing were constructed for 167-Mb/s optical receivers. They have the following characteristics:

| | |
|---|---|
| Bandwidth (3-dB-down electric bandwidth): | 140 MHz |
| Feedback resistance: | 141 kΩ |
| Sensitivity (at a maximum bit-error rate of $10^{-10}$): | −43 dBm |
| Measured amplifier input capacitance: | 0.24 pF. |

Thus, compared with the prior art amplifier referred to at the beginning ("Electronics Letters"...), the input capacitance is improved by 4.36 pF, the bandwidth by 28 MHz, and the sensitivity by 4.6 dB.

It should be pointed out that a resistor as shown in FIG. 2 is suited not only for transimpedance amplifiers but for all applications in which a resistor with a high value and a very low finite series capacitance is required.

Such an application is in a type of amplifier used alternatively to the transimpedance amplifier as a preamplifier for optical receivers: the so-called high-impedance amplifier, which is disclosed for example, in DE-OS 32 33 146, FIG. 1. In this amplifier, the input capacitance is increased by the series and shunt capacitances of the load resistor, thereby reducing the bandwidth. Therefore, this amplifier, too, requires a resistor with low series and shunt capacitance and, because of its contribution to the amplifier's input noise, with a high resistance value. These requirements are met by a resistor implemented as described with the aid of FIG. 2 and built into the amplifier as described with the aid of FIG. 3 or incorporated in the amplifier circuit in accordance with the alternative described.

Thus, the bandwidth and sensitivity of amplifiers of the so-called high-impedance type, too, can be improved considerably by the features of the invention which relate to the resistor.

We claim:

1. Transimpedance amplifier arrangement using current feedback through a resistor arranged between an output and an input of an amplifier, and serving to convert an input current into an output voltage, characterized in that the feedback resistor is constituted by a resistive strip provided on a substrate and having two spaced ends, that at least one pair of separate conductive strips lying on a straight line extend parallel to the resistive strip on the substate and each has one end close to and another end remote from the refractive other conductive strip of said pair, and that each of the two other ends of said conductive strips of said pair extends, and is connected, to a different one of said two spaced ends of said resistive strip.

2. The amplifier arrangement as claimed in claim 1, characterized in that the conductive strips of each pair are of different lengths, and that the end of the feedback resistor that is connected to the shorter conductive strip is connected to the amplifier input.

3. The amplifier arrangement as claimed in claim 2, characterized in that the conductive strips of each pair have perpendicular extensions.

4. The amplifier arrangement as claimed in claim 2 for use with an amplifier board and an amplifier case, characterized in that said substrate with said feedback resistor is located at a distance from the amplifier board and the amplifier case.

5. The amplifier arrangement as claimed in claim 2 for use with an amplifier board and an amplifier case, characterized in that said substrate with said feedback resistor form part of the amplifier board, and that said amplifier board is located at a distance from the amplifier case.

6. The amplifier arrangement as claimed in claim 2, characterized in that said amplifier contains a cascade stage comprising a gallium arsenide field-effect transistor and a following differential amplifier whose output voltage is used as an amplifier output voltage and generates said feedback current via said feedback resistor.

7. The amplifier arrangement as claimed in claim 3 for use with an amplifier board and an amplifier case, characterized in that the substrate with the feedback resistor is located at a distance from the amplifier board and the amplifier case.

8. The amplifier arrangement as claimed in claim 3 for use with an amplifier board and a amplifier case, characterized in that the substrate with the feedback resistor forms part of the amplifier board, and that the latter is located at a distance from the amplifier case.

9. The amplifier arrangement as claimed in claim 8, characterized in that the amplifier contains a cascade stage comprising a gallium arsenide field-effect transistor, which is followed by a differential amplifier whose output voltage is used as the amplifier output voltage and generates feedback current supplied to said feedback resistor.

10. The amplifier arrangement as claimed in claim 9, characterized in that it is direct-coupled throughout.

11. The amplifier arrangement as claimed in claim 4, characterized in that said amplifier contains a cascade stage comprising a gallium arsenide field-effect transistor and a following differential amplifier whose output voltage is used as an amplifier output voltage and generates said feedback current via said feedback resistor.

12. The amplifier arrangement as claimed in claim 1, characterized in that the conductive strips of each pair have perpendicular extensions.

13. The amplifier arrangement as claimed in claim 1 for use with an amplifier board and an amplifier case, characterized in that said substrate with said feedback resistor is located at a distance from the amplifier board and the amplifier case.

14. The amplifier arrangement as claimed in claim 9, characterized in that said amplifier contains a cascade stage comprising a gallium arsenide field-effect transistor and a following differential amplifier whose output voltage is used as an amplifier output voltage and generates said feedback current via said feedback resistor.

15. The amplifier arrangement as claimed in claim 1, characterized in that said amplifier contains a cascade stage comprising a gallium arsenide field-effect transistor and a following differential amplifier whose output voltage is used as an amplifier output voltage and generates said feedback current via said feedback resistor.

16. The amplifier arrangement as claimed in claim 1 for use with an amplifier board and an amplifier case, characterized in that said substrate with said feedback resistor form part of the amplifier board, and that said amplifier board is located at a distance from the amplifier case.

17. The amplifier arrangement as claimed in claim 16, characterized in that said amplifier contains a cascade stage comprising a gallium arsenide field-effect transistor and a following differential amplifier whose output voltage is used as an amplifier output voltage and generates said feedback current via said feedback resistor.

18. The amplifier arrangement as claimed in claim 11, characterized in that said amplifier contains a cascade stage comprising a gallium arsenide field-effect transistor and a following differential amplifier whose output voltage is used as an amplifier output voltage and generates said feedback current via said feedback resistor.

19. The amplifier arrangement as claimed in claim 3, characterized in that said amplifier contains a cascade stage comprising a gallium arsenide field-effect transistor and a following differential amplifier whose output voltage is used as an amplifier output voltage and generates said feedback current via said feedback resistor.

20. The amplifier arrangement as claimed in claim 1, characterized in that said amplifier contains a cascade stage comprising a gallium arsenide field-effect transistor and a following differential amplifier whose output voltage is used as an amplifier output voltage and generates said feedback current via said feedback resistor.

* * * * *